United States Patent
Sundararajan et al.

(10) Patent No.: US 9,305,771 B2
(45) Date of Patent: Apr. 5, 2016

(54) PREVENTION OF METAL LOSS IN WAFER PROCESSING

(71) Applicant: Intel Corporation, Santa Clara, CA (US)

(72) Inventors: Shakuntala Sundararajan, Hillsboro, OR (US); Nadia M. Rahhal-Orabi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/137,536

(22) Filed: Dec. 20, 2013

(65) Prior Publication Data

US 2015/0179463 A1    Jun. 25, 2015

(51) Int. Cl.
*H01L 21/302* (2006.01)
*H01L 21/02* (2006.01)

(52) U.S. Cl.
CPC .................. *H01L 21/02063* (2013.01)

(58) Field of Classification Search
USPC ............ 438/689, 690, 720, 637, 629; 216/37
See application file for complete search history.

(56) References Cited

U.S. PATENT DOCUMENTS

| | | | |
|---|---|---|---|
| 6,207,583 B1 * | 3/2001 | Dunne et al. | 438/725 |
| 6,358,324 B1 * | 3/2002 | Hongoh et al. | 118/728 |
| 6,564,811 B2 * | 5/2003 | Timperio et al. | 134/1.2 |
| 7,078,161 B2 | 7/2006 | Waldfriend et al. | |
| 7,083,903 B2 * | 8/2006 | Edelberg et al. | 430/329 |
| 7,220,668 B2 * | 5/2007 | Park et al. | 438/637 |
| 2011/0053375 A1 * | 3/2011 | Ishikawa et al. | 438/674 |

FOREIGN PATENT DOCUMENTS

WO    2006078382    11/2006

* cited by examiner

*Primary Examiner* — Duy Deo
*Assistant Examiner* — Maki Angadi
(74) *Attorney, Agent, or Firm* — Trop, Pruner & Hu, P.C.

(57) ABSTRACT

An embodiment includes a method comprising: etching a material to expose a metal component in a metal layer, which is located on a substrate, while the substrate is in an etch chamber that is under vacuum; and performing an ash process on the metal component while the substrate is still in the etch chamber that is still under vacuum; wherein the material includes at least one of a dielectric and a mask and the metal component includes at least one of an interconnect, a via, and a contact. Other embodiments are described herein.

14 Claims, 4 Drawing Sheets

PREVENTION OF METAL LOSS IN WAFER PROCESSING

TECHNICAL FIELD

Embodiments of the invention are in the field of semiconductor devices and, in particular, wafer processing.

BACKGROUND

Once semiconductor wafers are prepared, a large number of process steps are still necessary to produce desired semiconductor integrated circuits (ICs). In general the steps can be grouped into four areas: Front End Processing, Back End Processing, Test, and Packaging.

Front End Processing refers to the initial steps in the fabrication. In this stage the actual semiconductor devices (e.g., transistors) are created. A typical front end process includes: preparation of the wafer surface, patterning and subsequent implantation of dopants to obtain desired electrical properties, growth or deposition of a gate dielectric, and growth or deposition of insulating materials to isolate neighboring devices.

Once the semiconductor devices have been created they must be interconnected to form the desired electrical circuits. This "Back End Processing" involves depositing various layers of metal and insulating material in the desired pattern. Typically the metal layers consist of aluminum, copper, and the like. The insulating material may include $SiO_2$, low-K materials or interlayer dielectric (ILD), and the like. The various metal layers are interconnected by interconnects, which may include a line portion and a via portion. Vias may be formed by etching holes in the insulating material and depositing metal (e.g., Tungsten) in them. The line portion may be formed by etching trenches in the insulating material and depositing metal in them.

Once the Back End Processing has been completed, the semiconductor devices are subjected to a variety of electrical tests to determine if they function properly. Finally, the wafer is cut into individual die, which are then packaged in packages (e.g., ceramic or plastic packages) with pins or other connectors to other circuits, power sources, and the like.

As noted above, "patterning" occurs in Front End Processing. This patterning may include etching of materials, similar to the via and line etching referenced with regard to the Back End Processing. Generally, etching is a subtractive process in the course of which a solid may be dissolved in liquid chemicals (wet etching) or converted into gaseous compound(s) (dry etching). Etching process may use a plasma mediated process such as by RF (radio frequency) or by microwave power of hundreds kHz (kilohertz) or several GHz (gigahertz). Etching may entail removal of material by exposing the material to a bombardment of ions (e.g., a plasma of reactive gases such as fluorocarbons, oxygen, chlorine, boron trichloride; sometimes with addition of nitrogen, argon, helium and other gases) that dislodge portions of the material from the exposed surface. Other etching processes may include particle beam induced chemical etching technologies such as electron beam etching, ion beam etching, or laser etching. These particle beam etching processes are generally carried out in the presence of an etching gas such as xenon difluoride ($XeF_2$). In short, etching is a key process in semiconductor processing.

BRIEF DESCRIPTION OF THE DRAWINGS

Features and advantages of embodiments of the present invention will become apparent from the appended claims, the following detailed description of one or more example embodiments, and the corresponding figures, in which:

DETAILED DESCRIPTION

Figure 1:
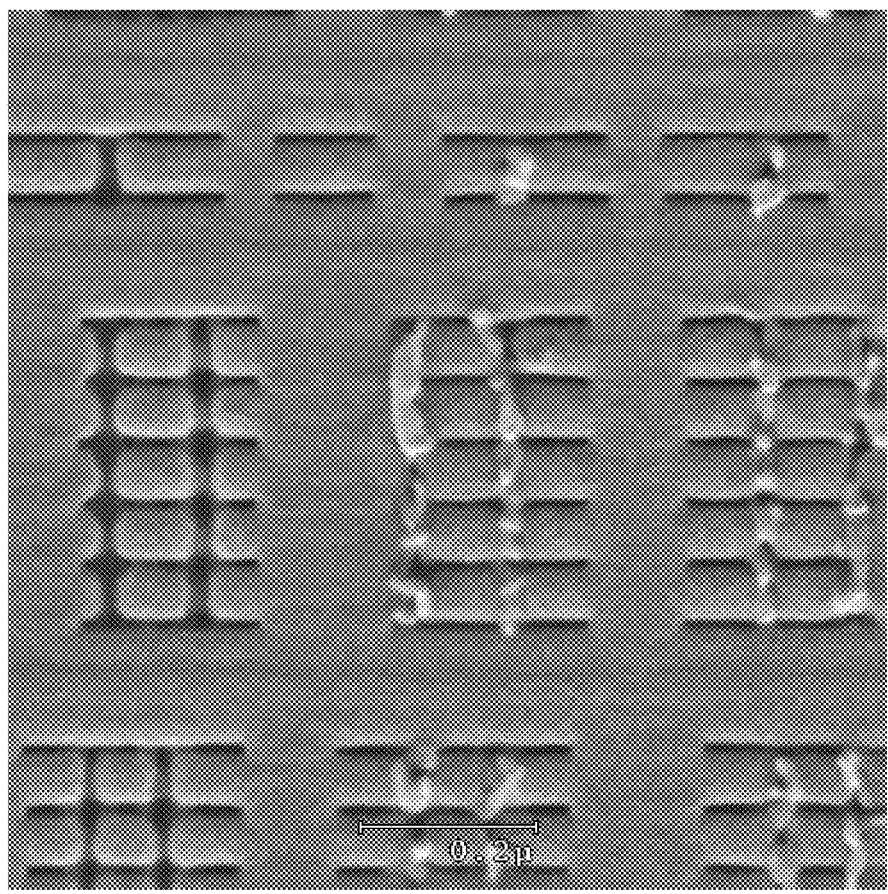
FIG. 1 depicts metal residue formed on a substrate.

Reference will now be made to the drawings wherein like structures may be provided with like suffix reference designations. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

Etching, described above, is not without complications. For example, many processes concern etching a dielectric/insulator material to reveal a metal that underlies the dielectric/insulator material. Ideally, a process targeted to remove dielectric and expose underlying metal will indeed remove the dielectric material but stop short of etching the metal. The metal will be ideally exposed, not etched. When the metal is unintentionally etched this is informally called "metal etch out" and is an undesirable "defect mode" or mechanism in semiconductor processing. More specifically, once the dielectric is removed/etched and the etching process ceases, etch byproducts remain behind and are in a highly reactive state. The highly reactive byproducts make the exposed metal surface susceptible to further etching (unwanted etching), even though etching has been completed. This unwanted etch occurs when the etched wafer and etch byproducts are exposed to ambient conditions.

Applicant has made great strides in identifying this etch out problem and the details underlying the problem. For example, a wafer is conventionally etched using an etch tool. This etching occurs in a controlled environment such as a vacuum (i.e., pressure less than ambient pressure surrounding the tool) where etching gases the wafer is exposed to, can be tightly controlled. As noted above, this etching exposes the metal and leaves etch byproducts in a highly reactive state. After etching the wafer is typically transferred from the etching tool, into ambient conditions, and then into an ash tool where leftover photoresist is removed using an ash process. Ashing involves removal (e.g., by volatilization) of materials from a surface of the wafer using, for example, oxidizing materials such as oxygen plasma. Photoresist is just an example of materials that can be removed during ashing and other embodiments more generally refer to ashable lithography stack materials that are not restricted to photoresist and include carbon hard mask (CHM), and the like. For example, post etch photoresist and etch residues are removed with relatively high temperature plasma ashing processes using fluorine or chlorine gas mixtures, wet chemical stripping processes, or a combination thereof.

However, Applicant has determined that in transferring the wafer from the etch tool to the ash tool, and exposing the wafer to ambient conditions during the transfer, the ambient conditions provide an opportunity for reactive substrates (moisture, plasma etch byproducts (e.g., fluorinated etch byproduct, chlorine etch byproduct), and/or $CO_2$, and the like) to interact with the exposed metal surface. Other ambient reactants and/or conditions, such as temperature and pressure, may also play a role in promoting metal etch out. As a result Applicant has determined the metal and the components it forms (e.g., metal gate, interconnects, and the like) experience etch out, which compromises the wafer and leads to a loss of function. For example, FIG. 1 shows a photo of etch out where small portions (chunks, bits, metallic residue) of metal are randomly deposited on the wafer. This metal residue is formed based on the reaction between the exposed metal and the etch byproducts and/or the reaction between the etch byproducts and ambient conditions.

The metal residue on the wafer can cause numerous problems. First, the residue can generate surface particle defects that can ruin one or more of the semiconductor devices that are being formed on the wafer. For example, such particles can cause ILD, which is deposited over the etched metal layer, to tear as it is being polished. Such ILD tear outs can damage multiple die that are positioned adjacent to the one upon which the particle is lodged. As the critical dimensions for IC devices continue to shrink, even very small particles can cause fatal defects. Second, the etch out of the metal where it was to form an interconnect (or essential part of the transistor) is destroyed or severely damaged. This leads to loss of function in the die where this defect mode occurs. In other words, if a metal via is to connect two parts of an IC and that metal via is inadvertently etched so that is does not make functional contact with the two parts of the IC then the IC will not function properly. Or the etched metal makes for an undesired contact/conductor leading to electrical shorting.

An embodiment of the invention addresses the above etch out problems by extinguishing or deactivating (or at least diminishing) etch byproducts. Specifically, an embodiment includes appending a step immediately after etch to extinguish the reactive etch byproducts. The extinguishing step may occur within 1-5 seconds of the completion of the etch step in some embodiments but within 5, 10, 15, or 20 seconds in other embodiments. In one embodiment, the step is an ash step that occurs in the same chamber as the etch step. In an embodiment, the step is an ash step that occurs in the same chamber as the etch step and at the same conditions as the etch step, wherein one of those conditions includes pressure (e.g., both the etch and the ash steps occur in the same chamber under vacuum without breaking the vacuum in between the etch and ash steps). Such an embodiment does not require extra hardware or tools and may be used within a conventional etch tool/chamber.

As used herein, this "ash step" that occurs in the etch chamber immediately after the etch may be viewed as a form of etch in that it uses etching (i.e., subtractive process in the course of which a material, such as etch byproduct, may be dissolved or converted into gaseous compound) to mimic what an asher or ash step entails (i.e., removal of unwanted materials from a surface of the wafer). The technical differences between an etch and ash step may be minimal. It is the intent behind the process that distinguishes the two from one another whereby an etch more typically removes materials to pattern something in the device and an ash more typically cleans that which is already patterned. In previous technologies ashers (separate tools from etchers) were used to perform the step that an embodiment now performs with standard etch tools.

An embodiment deactivates the reactive etch byproducts by adding the mild ash step "immediately" after the etch step. "Immediately", as used herein, is a relative term (e.g., 0-5 seconds) and does not necessarily mean the ash step must occur milliseconds after the etch step but instead connotes that the ash step is, in one embodiment, the next significant or substantive processing step that occurs (i.e., the ash step occurs before the wafer is transferred to another tool for wafer cleaning and in the process is exposed to ambient conditions).

The ash chemistry may be chosen according to the nature of the reactive etch byproducts. In an embodiment a mild $O_2$ ash is sufficient in eliminating etch out defect. This $O_2$ ash consumes/deactivates etch polymer byproduct (e.g., fluorinated etch by polymer) produced while the wafer is still in the plasma chamber. Etch byproduct may vary and depends on the process that generates the byproduct. For example, the byproduct may include a combination of a metal (that was exposed due to etching) and etchant material. The metal may include copper, cobalt, aluminum, tungsten, titanium, and other materials found in the Front End or Back End of the device. The etch material may include fluorocarbons, oxygen, chlorine, boron trichloride, nitrogen, argon, helium, and other gases. The ratio between the metal and etch constituents (and derivatives thereof) that make up the etch byproduct varies in different embodiments.

Figure 2:
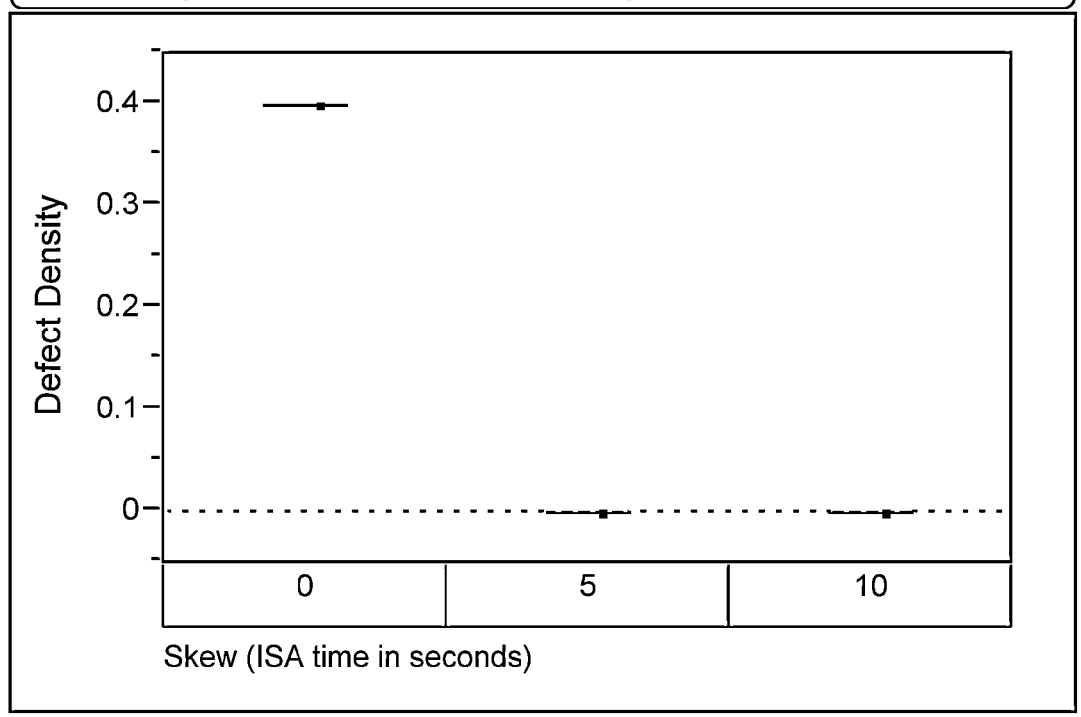
FIG. 2 depicts the effect of reducing metal residue formed on a substrate by using and embodiment of the invention.

Subsequently when the wafer is exposed to ambient conditions when moisture is present (i.e., after the etch and ash process are completed in the etch tool), metal etch out is greatly reduced or even eliminated. For example, FIG. 2 illustrates results from an "in situ" ash step (i.e., ash step conducted in the etch chamber under vacuum) that occurs immediately after the etch step. As in situ ash time increases defects decrease. More specifically, the Y Axis shows defect density expressed as fraction of scanned area. When in situ ashing time is zero metal etch out affects 40% of the wafer area scanned. The X axis includes in situ ash time within the etcher. With no in situ ashing post etch (0 seconds), incidence of the metal etch out defect mode is fairly high (40% of scanned area is affected). This is an estimate of incidence of this defect mode. Defect mode occurrence is almost eliminated by adding 5 seconds of in situ ashing. Increasing in situ ashing time to 10 seconds demonstrates the same trend.

While an $O_2$ ash is used in some embodiments, other embodiments use $H_2$ and He based ashes and combinations thereof to remove debris/byproduct caused by various etch chemistries including, for example, $CF_4$, $CH_2F_2$, $C_4F_8$, $C_4F_6$ etch chemistries.

In an embodiment an etcher includes a load cassette for loading a wafer into a load lock. From the load lock the wafer is transferred to an etch chamber. There etching occurs followed by an ash or cleaning step. After the etching and ashing is complete, in an embodiment the wafer is optionally transferred to an ash chamber where another ashing operation is carried out. The wafer is then moved to an unload lock, from which the wafer is removed for further processing. Thus, a single etcher machine may have separate tools or portions, such as an etch chamber and an ash chamber. In an embodiment the etch chamber is no longer limited to etching but further includes an ash step. In some embodiments, but not all embodiments, an additional ash step follows (but this step is omitted in other embodiments).

An embodiment provides a process that may stabilize metal structures formed using etching processes by treating the freshly exposed metal surfaces and/or etch byproduct to reduce or eliminate their reactivity. By reducing the reactivity of the freshly exposed surfaces and/or etch byproduct, the embodiment may stabilize the metal structures and/or etch byproduct and substantially minimize or eliminate the post-etch degradation (i.e., etch out) of the metal structures that often occurs.

Figure 3:
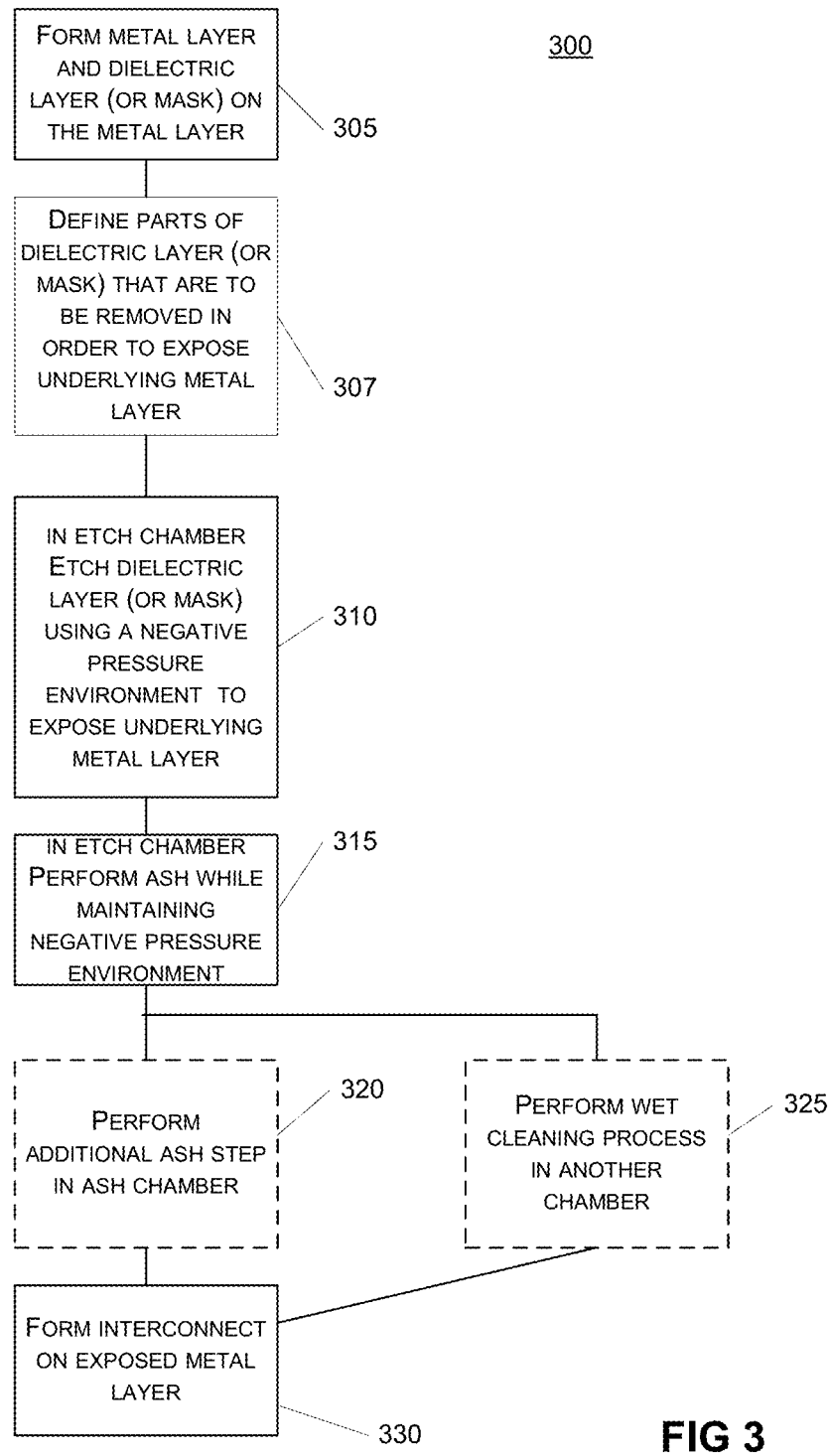
FIG. 3 depicts a process for prevention of metal loss in wafer processing in an embodiment of the invention.

FIG. 3 is a process 300 for preventing metal loss in wafer processing in an embodiment of the invention.

In block 305 a metal layer or layers is formed and a dielectric (or mask) is formed on the metal layer. The metal layer(s) may be formed using any metals that are typically used in semiconductor applications, including but not limited to tungsten (W), molybdenum (Mo), molybdenum-silicon (MoSi), tantalum (Ta), tantalum nitride (TaN), titanium (Ti), titanium nitride (TiN), $TaSi_xN_y$, alloys such as Ta, boron (B), and nitrogen (TaBN), and any combination of these metals or alloys. Other metals include copper (Cu), aluminum (Al), gold (Au), silver (Ag), and alloys of these and/or other metals.

In block 307 the process defines parts of the dielectric layer/mask that are to be removed in order to expose the underlying metal layer.

In block 310 in an etch chamber an etching process (e.g., particle beam etching, plasma etching) is carried out on the dielectric layer/mask (in a negative pressure environment relative to ambient pressure near the etch tool) to expose the underlying metal layer (e.g., one or more metal structures such as vias, interconnects, gates). For instance, electron beam etching may be carried out in a system that includes an electron column and a vacuum chamber that houses a stage and a gas injection system. Different systems or chambers may be used for ion beam etching processes and laser beam etching processes. In implementations of the invention, the etching gas may include, but is not limited to, $XeF_2$. Other embodiments may utilize a wet chemical etch or a plasma etching process in the etch chamber using $CF_4$, $CH_2F_2$, $C_4F_8$, $C_4F_6$ etch chemistries and the like. To carry out such an etching process, a layer of SLAM (Sacrificial Light Absorbing Material) and a layer of photoresist may have been deposited on the substrate and patterned (e.g., see blocks 305, 307). The SLAM and photoresist may each comprise any suitable material. In one embodiment, each of the SLAM and photoresist materials comprises a material that is amenable to removal by an ash process (see blocks 315 and 320).

After the metal structures are exposed due to etching of the dielectric/mask, an ash chemistry is introduced into the same etch chamber where the etching took place (block 315) while maintaining the negative pressure environment used for the etch (but not necessarily at the exact same pressure). In various embodiments the ash chemistry may include, but is not limited to, $O_2$ but other embodiments use $H_2$ and He based ashes and combinations thereof to remove debris/byproduct caused by various etch chemistries including, for example, $CF_4$, $CH_2F_2$, $C_4F_8$, and $C_4F_6$ etch chemistries. Other chemistries for the ash process of block 315 include He in conjunction with $N_2$ or Ar, and $O_2$ may be used in conjunction with Ar or $N_2$. In one embodiment the pressure of the ash gas near the surface of the metal structures may range from 50 to 1,000 milliTorr (mTorr). In some implementations, the ash gas may completely displace the etching gas in the chamber that was needed for the etching process. In other implementations, the ash gas may be mixed with the etching gas. In some embodiments the etching gas may be evacuated from the chamber prior to introducing the ash gas into the chamber.

According to one embodiment, the ash process is performed using a mixture of helium and hydrogen. In one embodiment, the He/$H_2$ mixture comprises between 1 and 5 percent hydrogen and up to 99 percent helium. In another embodiment, the wafer is in the etch chamber, and the He/$H_2$ mixture is introduced into the chamber at a flow rate of between 1,000 and 5,000 sccm. In further embodiments, during the ash process, the etch chamber (and/or substrate) is maintained at a temperature of between 200 and 300 degrees Celsius, and the chamber is maintained at a pressure of between 400 and 4,000 mTorr. In yet another embodiment, the substrate is exposed to the ash process for between 30 and 60 seconds.

In an embodiment the ash process of block 315 is performed with a 500 W RF bias applied to the substrate (whereas a typical ash process would not apply a RF bias to the substrate) although other embodiments may use higher or lower power RF bias. The embodiment also uses an $O_2$ flow=20 sccms and $N_2$ flow=500 sccms, a pressure at approximately 20 mT, and a temperature at about 20 degrees C. (whereas a typical ash process would require a temperature around 200 degrees C.). Thus, the ash process of block 315 is not like a typical ash process in that block 315 uses a RF bias and operates at a relatively lower temperature than normal ash processes.

Etch residue may still remain after block 315. In one embodiment this etch residue is also amenable to removal by an ash process performed using a He/$H_2$ chemistry. In block 320 an additional ash step is performed. This step is optional and does not occur in all embodiments. This occurs after the wafer or die is transferred from the etch chamber to the ash chamber. The ash process is performed to clean the metal structures (and other surfaces of the substrate). This ash process removes the SLAM and photoresist layers as well as etch residue. In one embodiment, the additional ash process to treat the wafer of block 320 is performed using the same ash chemistry (and other process parameters) as that used in block 315. In other embodiments, however, the ash chemistry and other process parameters used to treat the wafer in block 320 may be different than that used in block 315, and treatment in block 320 may be performed using any suitable ash chemistry under any suitable process conditions.

In an embodiment optional block 320 includes ashing conditions where the wafer is subjected to high temperatures of 200 to 300 degrees Celsius. The etch chemistry that is used may be a plasma based on $O_2$ (e.g., $O_2$/$N_2$/Ar) or He($N_2$) or a gas based on any or all of $H_2N_2$/$N_2$/Ar. The ashing itself takes place at a pressure lower that ambient pressure. Unlike in an etcher, there is no bias on the wafer. The reactive species in the asher removes material in an isotropic manner (unlike in an etcher where due to the applied bias on the wafer removal of material is predominantly anisotropic).

It should be noted that, in some embodiments, one or more of these material layers (e.g., SLAM layer) may be removed by an optional alternative process (e.g., a wet cleaning process (block 325)). For wet stripping/cleaning the particular wet strippers used may include, for example, acid strippers such as hydrofluoric acid, and basic strippers such as ammonia. In operation, the wet stripper is immersed, puddled, streamed, sprayed, or the like onto the wafer and subsequently rinsed with deionized water. In other embodiments block 325 may follow block 320 or block 320 may follow block 325.

Optionally, a rinsing step is employed immediately after blocks 320 and/or 325 to remove contaminants and/or photoresist residuals. The rinsing step may employ deionized water but may also include hydrofluoric acid and the like. The rinsing step, if applied, may comprise a spin rinse of about 5 to about 10 minutes followed by a spin drying process.

Block 330 includes forming interconnects (e.g., gate electrode, via, line) to contact or couple to the exposed metal layer.

Embodiments are valuable for current and future technologies as several embodiments provide a solution for metal etch out defect in the plasma etcher itself. In an embodiment no hardware change or upgrade is needed to conventional etchers (e.g., a Telius OXT etcher). The interaction between post wafer processing byproducts (e.g., plasma etch) and subsequent exposure to ambient fabrication conditions has been identified as a source of etch out. Adding an in-situ ash to deactivate/consume reactive materials post plasma processing is effective in eliminating or reducing this etch out defect mode. This methodology can be applicable to various steps in semiconductor processing with appropriate modification, depending on the particular case. For example, this methodology is applicable in frontend processing (where contacts to the transistor are exposed via plasma etch process) or in backend processing (where metal layers or via layers are etched or exposed).

Various embodiments include a semiconductive substrate. Such a substrate may be a bulk semiconductive material this is part of a wafer. In an embodiment, the semiconductive substrate is a bulk semiconductive material as part of a chip that has been singulated from a wafer. In an embodiment, the semiconductive substrate is a semiconductive material that is formed above an insulator such as a semiconductor on insulator (SOI) substrate. In an embodiment, the semiconductive substrate is a prominent structure such as a fin that extends above a bulk semiconductive material.

Processes discussed herein may utilize a system such as the system of FIG. 4, discussed below. In fact, embodiments may be used in many different types of systems. For example, the processes of FIG. 3 may be implemented as code for performing a process "recipe" to control the etch tool to carry out the etch of block 310 and the ash of block 315 and possibly other blocks of the flow chart.

Program instructions may be used to cause a general-purpose or special-purpose processing system that is programmed with the instructions to perform the operations described herein. Alternatively, the operations may be performed by specific hardware components that contain hardwired logic for performing the operations, or by any combination of programmed computer components and custom hardware components. The methods described herein may be provided as (a) a computer program product that may include one or more machine readable media having stored thereon instructions that may be used to program a processing system or other electronic device to perform the methods or (b) at least one storage medium having instructions stored thereon for causing a system to perform the methods. The term "machine readable medium" or "storage medium" used herein shall include any medium that is capable of storing or encoding a sequence of instructions (transitory media, including signals, or non-transitory media) for execution by the machine and that cause the machine to perform any one of the methods described herein. The term "machine readable medium" or "storage medium" shall accordingly include, but not be limited to, memories such as solid-state memories, optical and magnetic disks, read-only memory (ROM), programmable ROM (PROM), erasable PROM (EPROM), electrically EPROM (EEPROM), a disk drive, a floppy disk, a compact disk ROM (CD-ROM), a digital versatile disk (DVD), flash memory, a magneto-optical disk, as well as more exotic mediums such as machine-accessible biological state preserving or signal preserving storage. A medium may include any mechanism for storing, transmitting, or receiving information in a form readable by a machine, and the medium may include a medium through which the program code may pass, such as antennas, optical fibers, communications interfaces, etc. Program code may be transmitted in the form of packets, serial data, parallel data, etc., and may be used in a compressed or encrypted format. Furthermore, it is common in the art to speak of software, in one form or another (e.g., program, procedure, process, application, module, logic, and so on) as taking an action or causing a result. Such expressions are merely a shorthand way of stating that the execution of the software by a processing system causes the processor to perform an action or produce a result.

Figure 4:
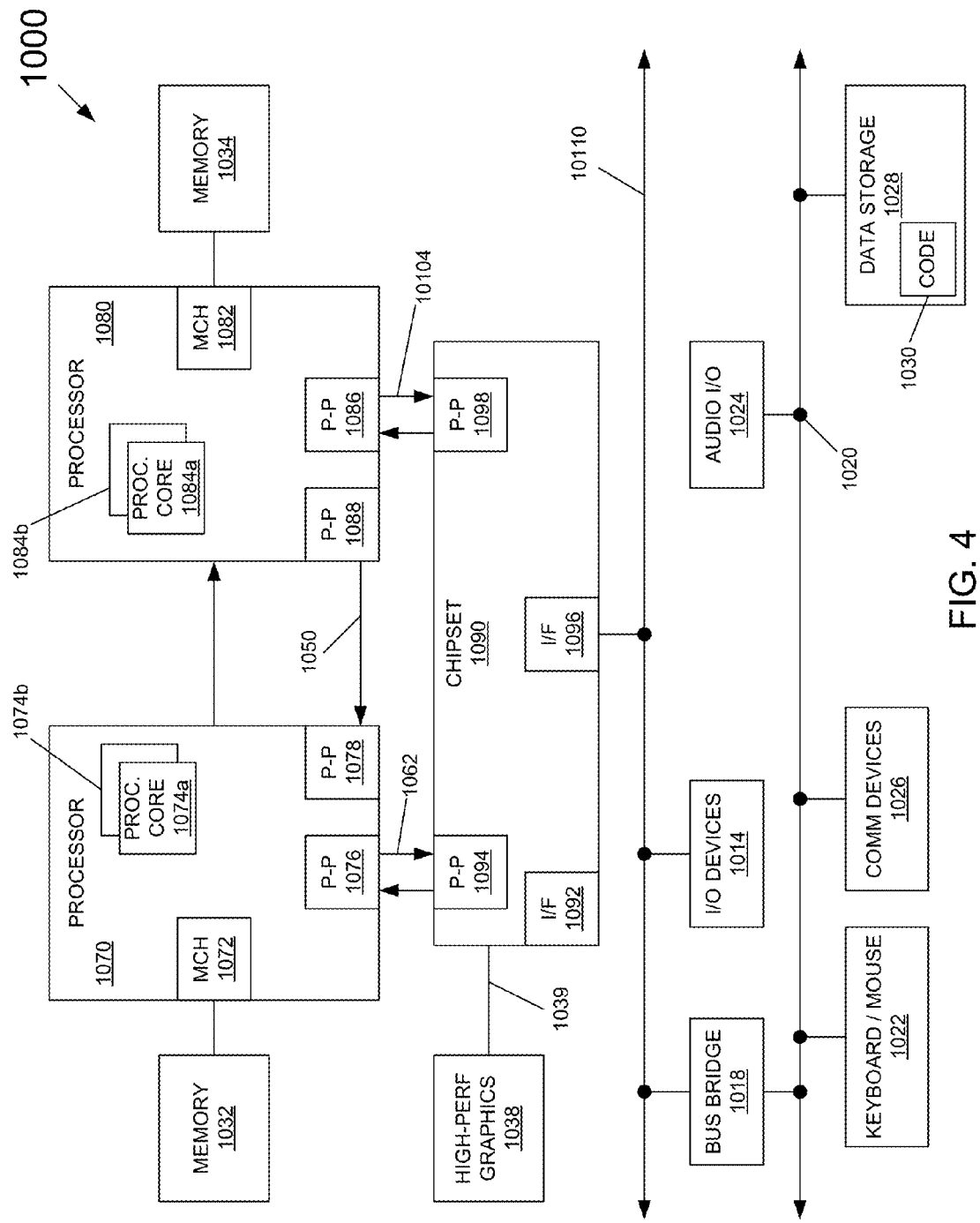
FIG. 4 is a system for use with an embodiment of the invention.

Referring now to FIG. 4, shown is a block diagram of a system embodiment 1000 in accordance with an embodiment of the present invention. System 1000 may be included in, for example, a mobile computing node such as a cellular phone, Smartphone, tablet, Ultrabook®, notebook, laptop, personal digital assistant, and mobile processor based platform.

Shown is a multiprocessor system 1000 that includes a first processing element 1070 and a second processing element 1080. While two processing elements 1070 and 1080 are shown, it is to be understood that an embodiment of system 1000 may also include only one such processing element. System 1000 is illustrated as a point-to-point interconnect system, wherein the first processing element 1070 and second processing element 1080 are coupled via a point-to-point interconnect 1050. It should be understood that any or all of the interconnects illustrated may be implemented as a multi-drop bus rather than point-to-point interconnect. As shown, each of processing elements 1070 and 1080 may be multicore processors, including first and second processor cores (i.e., processor cores 1074a and 1074b and processor cores 1084a and 1084b). Such cores 1074, 1074b, 1084a, 1084b may be configured to execute instruction code in a manner similar to methods discussed herein.

Each processing element 1070, 1080 may include at least one shared cache. The shared cache may store data (e.g., instructions) that are utilized by one or more components of the processor, such as the cores 1074a, 1074b and 1084a, 1084b, respectively. For example, the shared cache may locally cache data stored in a memory 1032, 1034 for faster access by components of the processor. In one or more embodiments, the shared cache may include one or more mid-level caches, such as level 2 (L2), level 3 (L3), level 4 (L4), or other levels of cache, a last level cache (LLC), and/or combinations thereof.

While shown with only two processing elements 1070, 1080, it is to be understood that the scope of the present invention is not so limited. In other embodiments, one or more additional processing elements may be present in a given processor. Alternatively, one or more of processing elements 1070, 1080 may be an element other than a processor, such as an accelerator or a field programmable gate array. For example, additional processing element(s) may include additional processors(s) that are the same as a first processor 1070, additional processor(s) that are heterogeneous or asymmetric to first processor 1070, accelerators (such as, e.g., graphics accelerators or digital signal processing (DSP) units), field programmable gate arrays, or any other processing element. There can be a variety of differences between the processing elements 1070, 1080 in terms of a spectrum of metrics of merit including architectural, microarchitectural, thermal, power consumption characteristics, and the like. These differences may effectively manifest themselves as asymmetry and heterogeneity amongst the processing elements 1070, 1080. For at least one embodiment, the various processing elements 1070, 1080 may reside in the same die package.

First processing element 1070 may further include memory controller logic (MC) 1072 and point-to-point (P-P) interfaces 1076 and 1078. Similarly, second processing element 1080 may include a MC 1082 and P-P interfaces 1086 and 1088. MC's 1072 and 1082 couple the processors to respective memories, namely a memory 1032 and a memory 1034, which may be portions of main memory locally attached to the respective processors. While MC logic 1072 and 1082 is illustrated as integrated into the processing elements 1070, 1080, for alternative embodiments the MC logic may be discrete logic outside the processing elements 1070, 1080 rather than integrated therein.

First processing element 1070 and second processing element 1080 may be coupled to an I/O subsystem 1090 via P-P interfaces 1076, 1086 via P-P interconnects 1062, 10104, respectively. As shown, I/O subsystem 1090 includes P-P interfaces 1094 and 1098. Furthermore, I/O subsystem 1090 includes an interface 1092 to couple I/O subsystem 1090 with a high performance graphics engine 1038. In one embodiment, a bus may be used to couple graphics engine 1038 to I/O subsystem 1090. Alternately, a point-to-point interconnect 1039 may couple these components.

In turn, I/O subsystem 1090 may be coupled to a first bus 10110 via an interface 1096. In one embodiment, first bus 10110 may be a Peripheral Component Interconnect (PCI) bus, or a bus such as a PCI Express bus or another third generation I/O interconnect bus, although the scope of the present invention is not so limited.

As shown, various I/O devices 1014, 1024 may be coupled to first bus 10110, along with a bus bridge 1018 which may couple first bus 10110 to a second bus 1020. In one embodiment, second bus 1020 may be a low pin count (LPC) bus. Various devices may be coupled to second bus 1020 including, for example, a keyboard/mouse 1022, communication device(s) 1026 (which may in turn be in communication with a computer network), and a data storage unit 1028 such as a disk drive or other mass storage device which may include code 1030, in one embodiment. The code 1030 may include instructions for performing embodiments of one or more of the methods described above. Further, an audio I/O 1024 may be coupled to second bus 1020.

Note that other embodiments are contemplated. For example, instead of the point-to-point architecture shown, a system may implement a multi-drop bus or another such communication topology. Also, the elements of FIG. 4 may alternatively be partitioned using more or fewer integrated chips than shown in the FIG. 4.

The following examples pertain to further embodiments.

Example 1 includes etching a material to expose a metal component in a metal layer, which is located on a substrate, while the substrate is in an etch chamber that is under vacuum; and performing an ash process on the metal component while the substrate is still in the etch chamber that is still under vacuum; wherein the material includes at least one of a dielectric and a mask and the metal component includes at least one of an interconnect, a via, and a contact.

In example 2 the subject matter of the Example 1 can optionally include breaking the vacuum after performing the ash process but not between etching the material and performing the ash process.

In example 3 the subject matter of the Examples 1-2 can optionally include breaking the vacuum; transferring the substrate from the etch chamber to an ash chamber after breaking the vacuum; and performing an additional ash process on the metal component while the substrate is in the ash chamber.

In example 4 the subject matter of the Examples 1-3 can optionally include wherein performing the ash process comprises using a gas selected from the group comprising O2, H2, He, N2, and Ar and combinations thereof.

In example 5 the subject matter of the Examples 1-4 can optionally include etching the material includes etching using a composition selected from the group comprising CF4, CH2F2, C4F8, C4F6, and combinations thereof; and the metal layer includes a material selected from the group comprising W, Mo, MoSi, Ta, TaN, Ti, TiN, Ta6Ny, TaBN, Cu, Al, Au, Ag, and combinations thereof.

In example 6 the subject matter of the Examples 1-5 can optionally include wherein performing the ash process comprises initiating performing the ash process within 10 seconds of finishing etching the material.

In example 7 the subject matter of the Examples 1-6 can optionally include wherein performing the ash process comprises performing the ash process for between 5 and 35 seconds.

In example 8 the subject matter of the Examples 1-7 can optionally include performing the ash process at a temperature less than 50 degrees Celsius.

In example 9 the subject matter of the Examples 1-8 can optionally include performing the ash process at a temperature between 15 and 25 degrees Celsius.

In example 10 the subject matter of the Examples 1-9 can optionally include applying a radiofrequency (RF) bias to the substrate while etching the material and applying a RF bias to the substrate when performing the ash step.

In example 11 the subject matter of the Examples 1-10 can optionally include wherein etching the material includes generating etch byproduct and performing the ash process includes removing at least a portion of the etch byproduct.

In example 12 the subject matter of the Examples 1-11 can optionally include wherein performing the ash process comprises performing the ash process (a) within 10 seconds of finishing etching the material, (b) at a temperature less than 50 degrees Celsius, and (c) using a gas selected from the group comprising O2, H2, He, N2, and Ar and combinations thereof.

Example 13 includes at least one storage medium having instructions stored thereon for causing a system to perform operations comprising: etching a material to expose a metal component in a metal layer, which is located on a substrate, while the substrate is in an etch chamber that is under vacuum; and performing an ash process on the metal component while the substrate is still in the etch chamber that is still under vacuum; wherein the material includes at least one of a dielectric and a mask and the metal component includes at least one of an interconnect, a via, and a contact.

In example 14 the subject matter of the Example 13 can optionally include the operations comprising breaking the vacuum after performing the ash process but not between etching the material and performing the ash process.

In example 15 the subject matter of the Examples 13-14 can optionally include wherein performing the ash process comprises initiating performing the ash process within 10 seconds of finishing etching the material.

In example 16 the subject matter of the Examples 13-15 can optionally include the operations comprising performing the ash process at a temperature less than 50 degrees Celsius.

In example 17 the subject matter of the Examples 13-16 can optionally include the operations comprising applying a radiofrequency (RF) bias to the substrate while etching the material and applying a RF bias to the substrate when performing the ash step.

Example 18 includes a method comprising: etching a material to expose a metal component located on a substrate in an etch chamber at negative pressure relative to ambient conditions outside the etch chamber; and performing an ash process on the metal component while the substrate is still in the etch chamber at at least one of the negative pressure and another negative pressure; wherein the material includes at least one of a dielectric and a mask and the metal component includes at least one of an interconnect, a via, and a contact.

In example 19 the subject matter of the Example 18 can optionally include bringing the etch chamber to atmospheric pressure after performing the ash process but not between etching the material and performing the ash process.

In example 20 the subject matter of the Examples 18-19 can optionally include wherein performing the ash process comprises initiating performing the ash process within 10 seconds of finishing etching the material.

An embodiment includes a method executed by at least one processor comprising: etching a material to expose a metal component in a metal layer, which is located on a substrate, while the substrate is in an etch chamber that is under vacuum; and performing an ash process on the metal component while the substrate is still in the etch chamber that is still under vacuum; wherein the material includes at least one of a dielectric and a mask and the metal component includes at least one of an interconnect, a via, and a contact. The embodiment may include breaking the vacuum after performing the ash process but not between etching the material and performing the ash process. The embodiment may include wherein performing the ash process comprises initiating performing the ash process within 10 seconds of finishing etching the material. The embodiment may include performing the ash process at a temperature less than 50 degrees Celsius. The embodiment may include applying a radiofrequency (RF) bias to the substrate while etching the material and applying a RF bias to the substrate when performing the ash step. An embodiment include at least one machine readable medium comprising a plurality of instructions that in response to being executed on a computing device, cause the computing device to carry out a method according to any one of the above embodiments in this paragraph.

The foregoing description of the embodiments of the invention has been presented for the purposes of illustration and description. It is not intended to be exhaustive or to limit the invention to the precise forms disclosed. The term "on" as used herein (including in the claims) does not indicate that a first layer "on" a second layer is directly on and in immediate contact with the second layer unless such is specifically stated; there may be a third layer or other structure between the first layer and the second layer on the first layer. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method comprising:
    etching a material to expose a metal component in a metal layer, which is located on a substrate, while the substrate is in an etch chamber that is under vacuum;
    performing an ash process on the metal component while the substrate is still in the etch chamber that is still under vacuum; and
    breaking the vacuum after performing the ash process but not between etching the material and performing the ash process;
    wherein the material includes at least one of a dielectric and a mask and the metal component includes at least one of an interconnect, a via, and a contact.

2. The method of claim 1 comprising:
    transferring the substrate from the etch chamber to an ash chamber after breaking the vacuum; and
    performing an additional ash process on the metal component while the substrate is in the ash chamber.

3. The method of claim 1, wherein performing the ash process comprises using a gas selected from the group comprising $O_2$, $H_2$, He, $N_2$, and Ar and combinations thereof.

4. The method of claim 3, wherein:
    etching the material includes etching using a composition selected from the group comprising $CF_4$, $CH_2F_2$, $C_4F_8$, $C_4F_6$, and combinations thereof; and
    the metal layer includes a material selected from the group comprising W, Mo, MoSi, Ta, TaN, Ti, TiN, $Ta_6Ny$, TaBN, Cu, Al, Au, Ag, and combinations thereof.

5. The method of claim 1, wherein performing the ash process comprises initiating performing the ash process within 10 seconds of finishing etching the material.

6. The method of claim 5, wherein performing the ash process comprises performing the ash process for between 5 and 35 seconds.

7. The method of claim 1 comprising performing the ash process at a temperature less than 50 degrees Celsius.

8. The method of claim 7 comprising performing the ash process at a temperature between 15 and 25 degrees Celsius.

9. The method of claim 7 comprising applying a radiofrequency (RF) bias to the substrate while etching the material and applying a RF bias to the substrate when performing the ash step.

10. The method of claim 1, wherein etching the material includes generating etch byproduct and performing the ash process includes removing at least a portion of the etch byproduct.

11. The method of claim 1, wherein performing the ash process comprises performing the ash process (a) within 10 seconds of finishing etching the material, (b) at a temperature less than 50 degrees Celsius, and (c) using a gas selected from the group comprising $O_2$, $H_2$, He, $N_2$, and Ar and combinations thereof.

12. A method comprising:
    etching a material to expose a metal component located on a substrate in an etch chamber at negative pressure relative to ambient conditions outside the etch chamber; and
    performing an ash process on the metal component while the substrate is still in the etch chamber at the negative pressure;
    wherein the material includes at least one of a dielectric and a mask and the metal component includes at least one of an interconnect, a via, and a contact.

13. The method of claim 12 comprising bringing the etch chamber to atmospheric pressure after performing the ash process but not between etching the material and performing the ash process.

14. The method of claim 13, wherein performing the ash process comprises initiating performing the ash process within 10 seconds of finishing etching the material.

* * * * *